United States Patent [19]

Sato

[11] Patent Number: 5,063,031
[45] Date of Patent: Nov. 5, 1991

[54] APPARATUS FOR GROWING VAPOR PHASE LAYER ON SEMICONDUCTOR SUBSTRATE

[75] Inventor: Mitsuo Sato, Zama, Japan

[73] Assignee: Kabushiki Kaisha Toshiba, Kawasaki, Japan

[21] Appl. No.: 570,555

[22] Filed: Aug. 21, 1990

[30] Foreign Application Priority Data

Aug. 24, 1989 [JP] Japan ................... 1-217845

[51] Int. Cl.⁵ .................... F16K 1/16; C23C 16/52
[52] U.S. Cl. ..................... 422/245; 29/25.01; 118/725; 118/730
[58] Field of Search ............ 118/715, 716, 725, 730; 422/245; 29/25.01, 25.02

[56] References Cited

U.S. PATENT DOCUMENTS

| 4,466,872 | 8/1984 | Einbinder | 118/715 |
| 4,777,022 | 10/1988 | Boldish et al. | 118/725 |
| 4,821,674 | 4/1989 | de Boer et al. | 118/730 |
| 4,828,224 | 5/1989 | Crabb et al. | 118/715 |
| 4,846,102 | 7/1989 | Ozias | 118/730 |

FOREIGN PATENT DOCUMENTS 0200752 11/1984 Japan ................... 118/725

Primary Examiner—Olik Chaudhuri
Assistant Examiner—Ken Horton
Attorney, Agent, or Firm—Finnegan, Henderson, Farabow, Garrett, and Dunner

[57] ABSTRACT

A reaction tube is fastened to a base plate by a plurality of bolts. A hollow shaft is secured to the base plate by a bearing interposed therebetween, and to be rotated by a motor. A casing secured to the shaft is arranged in the reaction tube, and has an opening closed by a susceptor on which a semiconductor substrate is to be placed. A heat-generating resistor is arranged in the casing. A thermocouple detects the temperature of the substrate. A temperature control circuit controls the temperature of the resistor by the output of the thermocouple.

6 Claims, 3 Drawing Sheets

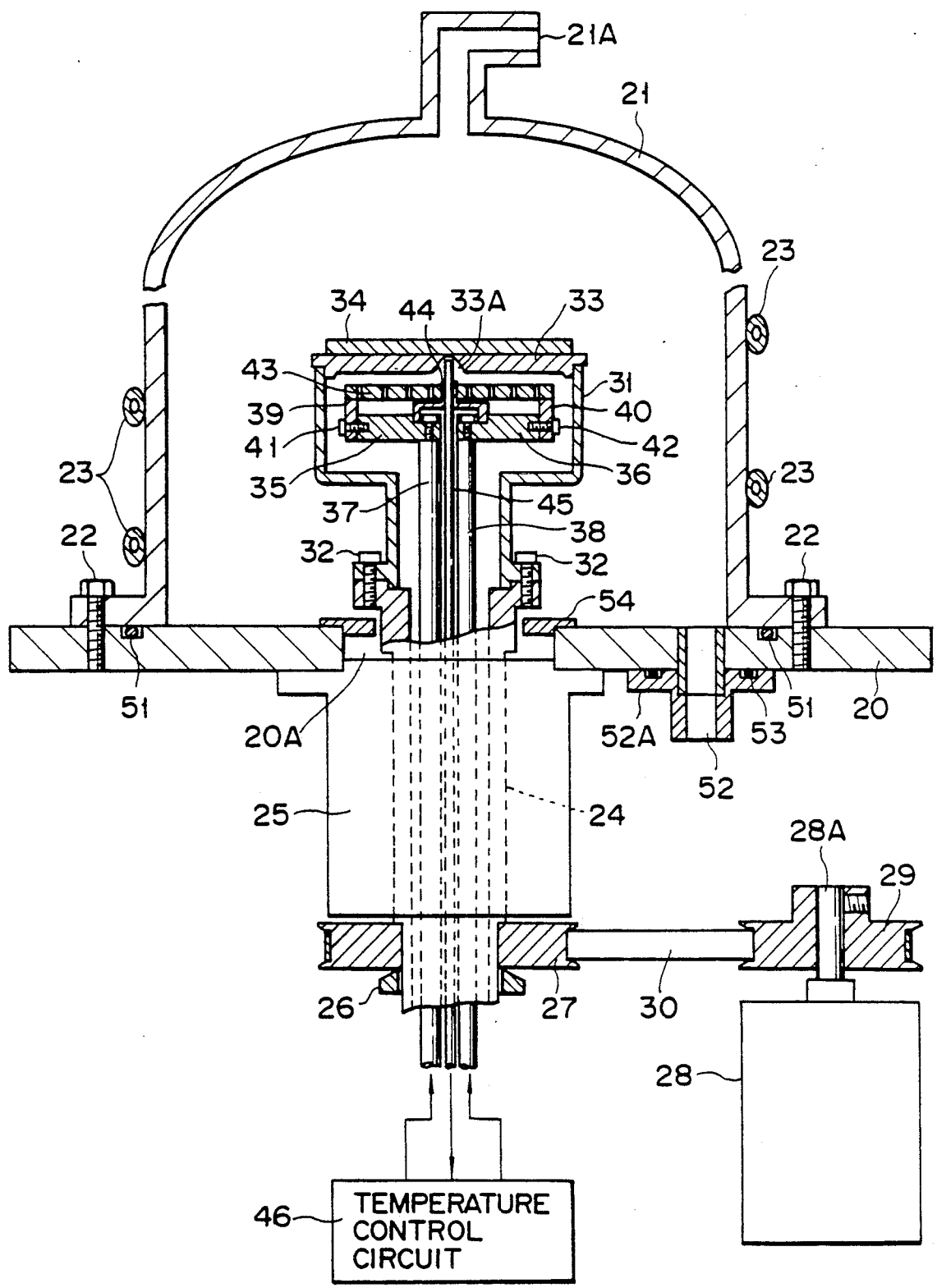
F I G. 3

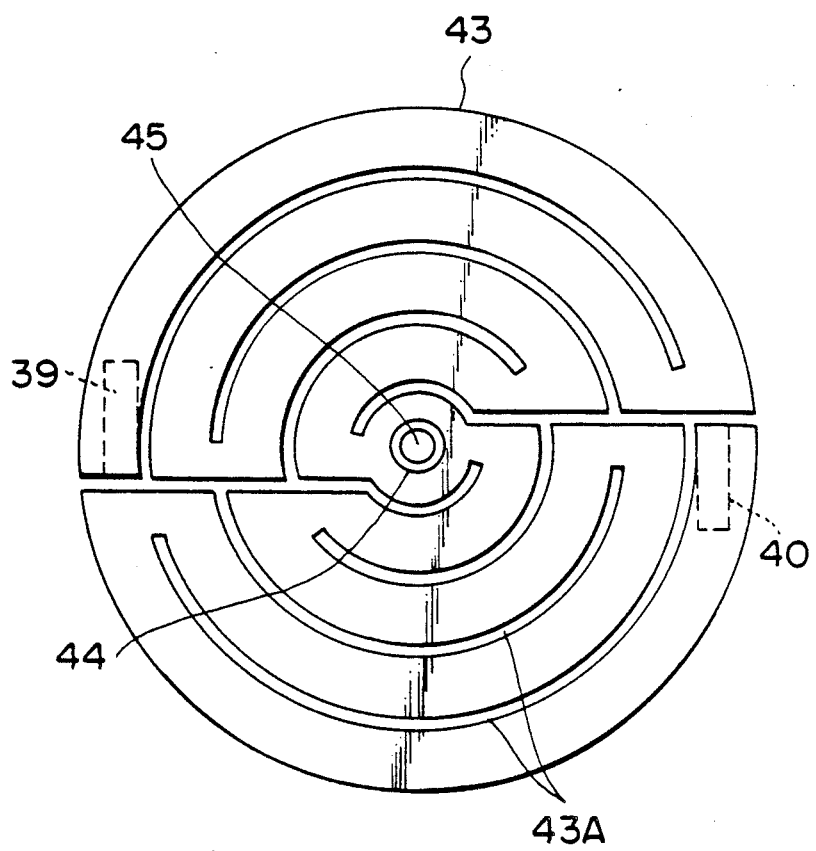
F I G. 4

APPARATUS FOR GROWING VAPOR PHASE LAYER ON SEMICONDUCTOR SUBSTRATE

BACKGROUND OF THE INVENTION

1. Field of the Invention

This invention relates to an improved apparatus for growing a vapor phase layer on a semiconductor substrate.

2. Description of the Related Art

A vapor-phase growing apparatus incorporating a high-frequency induction heater is generally employed for depositing a MOCVD (Metal Organic Chemical Vapor Deposition) layer on a semiconductor substrate of III-V group compound such as a GaAs.

FIG. 1 shows such a conventional vapor-phase growing apparatus. A housing 1 houses a reaction tube 2, a coil 3 for high-frequency induction heating, and an elevator 4. The reaction tube 2 is formed of quartz, and provided with an introduction pipe 2A connected to a gas-supply apparatus, not shown, for introducing gas from the supply apparatus into the tube 2. The coil 3 is wound around the reaction tube 2, and connected to the elevator 4, thereby to be moved up and down. The elevator 4 is connected to one end of each of two cables 5, which are connected to a high-frequency generator 6 at the other end. The cables 5, extending between the housing 1 and generator 6, are covered with a safe cover 7.

FIG. 2 shows an essential part of the reaction tube 2. A susceptor 8 formed of carbon is arranged in the tube 2, for supporting a GaAs semiconductor substrate 9. The susceptor 8 is supported by a hollow shaft 10 connected to a driving member (not shown) and can be rotated by the driving member. Thus, the surface of the substrate 9 can react with gas while rotating at a constant rate, whereby a vapor-phase layer is formed at high yield.

A thermocouple 11 is inserted in the hollow shaft 10, for detecting the temperature of the susceptor 8. The temperature of the susceptor 8 is controlled by the output of the thermocouple 11. The elevator 4 is moved to adjust the position of the coil 3 such that the number of the windings of the coil 3, which surround that portion of the tube located above the substrate 9, is substantially equal to the number of the windings which surround that portion of the same located below the substrate 6. Further, the coil 3 is formed by a pipe through which water can flow to cool the coil.

The conventional vapor-phase growing apparatus, described above, has the following disadvantages:

The high-frequency generator 6 (frequency: 300 KHz; output: 10 KW) incorporated in the apparatus is very expensive, and requires a large space. Further, to install the generator 6, a special working is required: for example, a grounding rod must be embedded at a location remote from it.

Moreover, it is complex to put a semiconductor substrate in and out of the reaction tube 2 wound by the coil 3. That is, whenever the substrate 9 is put in or out of the reaction tube 2, the elevator 4 is moved up to remove the coil 3 from the reaction tube 2, and then the tube is removed from the housing 1. The substrate is then placed on the susceptor 8, the tube is again secured to the housing, and the elevator 4 is moved down to support the coil 3 in a desired position. The coil 3 must be positioned accurately; otherwise the thickness of the vapor-phase layer formed on the substrate 9 will vary.

In addition, since the reaction tube formed of quartz is easily broken, it is difficult to handle.

SUMMARY OF THE INVENTION

It is the object of the present invention to provide an apparatus for depositing a layer on a semiconductor substrate by CVD process, which is inexpensive, compact, and easy to handle.

To attain the above object, the apparatus of the present invention comprises:

a container to be supplied with a predetermined gas;

a casing rotatably arranged in the container;

a susceptor arranged in the casing, on which a semiconductor substrate is to be placed; and a heat generator arranged in the casing, for heating the susceptor and semiconductor substrate.

According to the present invention, the heat generator is arranged in the casing, together with the susceptor, so as to heat the susceptor and substrate. Thus, an expensive high-frequency induction heater is not required, which enables the apparatus to be manufactured at low cost.

Further, the apparatus according to the invention does not employ a coil, incorporated in the high-frequency induction heater, which must be adjusted in position whenever a semiconductor substrate is replaced another, so that no adjustments are required even when the substrate is replaced, which facilitates the operation of the apparatus.

Furthermore, the apparatus requires no special workings for providing a ground terminal, in contrast to an apparatus employing the high-frequency induction heater.

The container or reaction tube is formed of stainless steel, which enables the apparatus to be manufactured at low cost and to handle with ease.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 3 is a sectional view showing an apparatus according to an embodiment of the present invention; and FIG. 4 is a plan view showing an essential part of the apparatus shown in FIG. 3.

DETAILED DESCRIPTION OF THE PREFERRED EMBODIMENT

Figure 1:
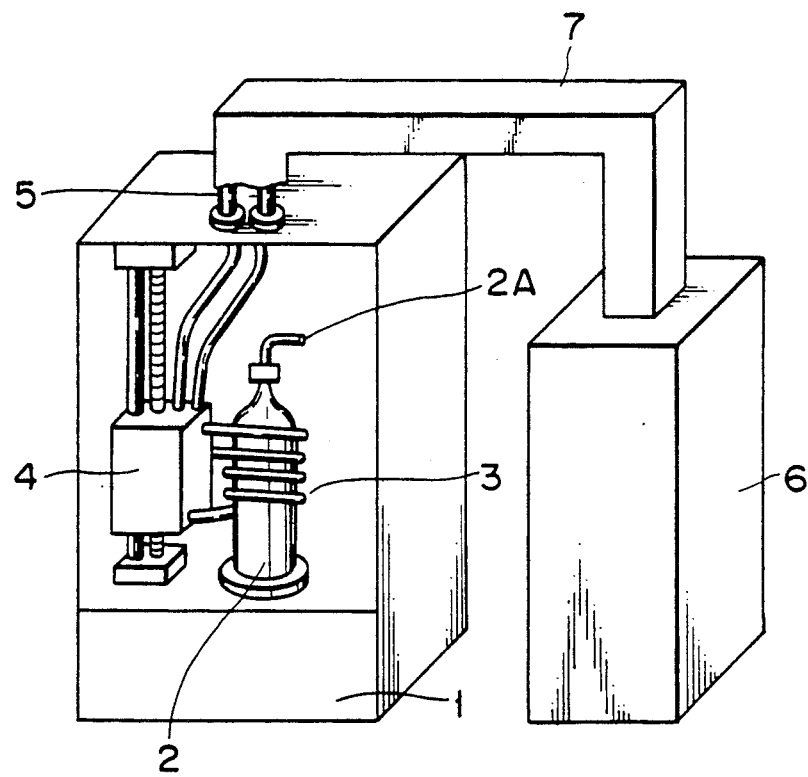
FIG. 1 is a perspective view showing a conventional vapor-phase growing apparatus.
Figure 2:
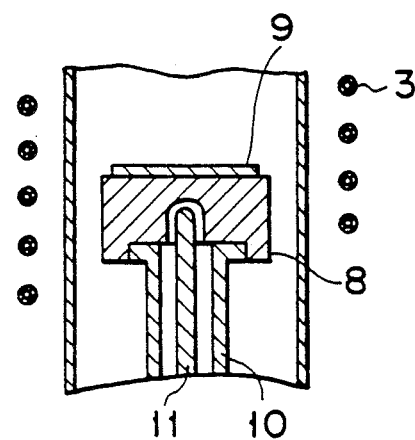
FIG. 2 is a sectional view showing an essential part of the apparatus shown in FIG. 1.

This invention will now be explained in detail with reference to the accompanying drawings showing an embodiment thereof.

In FIG. 3, a reaction container 21, formed of, for example, stainless steel, is removably screwed to a base plate 20 by a plurality of bolts 22. The container 21 has an upper portion provided with a pipe 21A, through which gas is supplied from a gas supply device, not shown, into the container 21. A plurality of pipes 23 for cooling the container 21 are mounted on the outer peripheral surface of the container 21. The base plate 20 has an annular sealing member 51 provided in a surface thereof contacting the reaction container 21, and further has an exhaust pipe 52 for exhausting gas through the base plate 20. The pipe 52 has a flange 52A having a surface thereof provided with an annular sealing member 53.

The base plate 20 has an opening 20A at the center, and an upper surface thereof provided with an annular cover 54 covering a peripheral part of the opening 20A. A hollow shaft 24 extends through the cover 54, and is rotatably supported by a bearing 25 secured to the lower surface of the base plate 20. Thus, the opening 20A is sealed by the bearing 25. Preferably, a bearing which seals a magnetic fluid, manufactured by Ferrofluidics corporation, is used as the bearing 25.

The shaft 24 has a lower end portion on which a pulley 27 is mounted by means of a nut 26. The pulley 27 is connected, by way of a belt 30, to a pulley 29 located in the vicinity of the pulley 27 and connected to a motor 28 via a shaft 28A. Accordingly, the shaft 24 can be rotated by the motor 28 via the pulleys 29 and 27 and belt 30.

The shaft 24 has the other end portion to which a casing 31 is secured by a plurality of bolts 32. The casing 31 has an open end remote from the base plate 20 and provided with a susceptor 33 formed of, for example, molybdenum or graphite, and sealing the casing 31. A semiconductor substrate 34 formed of, for example a III-V group compound is placed on the susceptor 33. The casing 31, susceptor 33 and semiconductor substrate 34 are mounted to rotate with the rotation of the shaft 24.

Supporting members 35 and 36 formed of a conductor are arranged in the casing 31 and secured respectively to bolts 37A and 38A provided on the tip portions of electrode terminals 37 and 38 fixed against rotation within the hollow shaft 24. The members 35 and 36, thus retained against rotation, support conductive leg members 39 and 40 fixed by bolts 41 and 42, respectively. The members 39 and 40 support both opposite end portions of a heat-generating resistor 43 spaced from the susceptor 33.

The resistor 43 is made of tungsten, molybdenum or carbon, for example and as shown in FIG. 4, is of circular configuration and provided with slots 43A shaped to provide a continuous resistive path through a series of arcuate segments between the members 39 and 40. Electric power is supplied to the resistor 43 from the electrode terminals 37 and 38 through the supporting members 35 and 36, and the leg members 39 and 40, to thereby heat the same. Further, the resistor 43 is provided with a thermocouple 45 extending through the axis thereof, and an insulating member 44 encircling the thermocouple 45. The tip portion of the thermocouple 45 is located in a concave recess 33A formed in the susceptor 33 without contact with the same. The thermocouple 45 is arranged within the shaft 24, together with the electrode terminals 37 and 38. These members 45, 37 and 38 are connected to a temperature control circuit 46 for controlling the power to be supplied to the electrode terminals 37 and 38 in response to the temperature of the susceptor 33 detected by the thermocouple 45.

Then, the operation of the above-described apparatus will be explained.

First, the bolts 22 are removed from the apparatus to remove the reaction container 21 from the base plate 20. Then, the semiconductor substrate 34 is placed on the susceptor 33, and thereafter the reaction container 21 is again secured to the plate 20 by fastening the bolts 22. When the motor 28 is turned on, the susceptor 33 rotates, together with the substrate 34. Subsequently, the temperature control circuit 46 supplies electric power to the resistor 43 through the electrode terminals 37 and 38, and the resistor 43 thus heated increases the temperature of the susceptor 33 and semiconductor 34 to a predetermined value. In this state, a raw gas and a carrier gas, for example, are supplied into the reaction container 21 through the pipe 21A, whereby a vapor-phase grown layer is formed on the semiconductor substrate 34. After a predetermined vapor-phase grown layer is formed, the gas in the reaction container 21 are purged from the exhaust pipe. Finally, the reaction container 21 is removed from the base plate 20 in the above-described manner, and the semiconductor substrate 34 is taken out.

In the above-described embodiment, the heat-generating resistor 43 is arranged within the casing 31 accommodating the susceptor 33, and adapted to heat the susceptor 33 and semiconductor substrate 34, which requires no expensive high-frequency induction heaters, resulting in a low manufacturing cost.

If a high-frequency induction heater is used, the position of a coil incorporated in the heater must be adjusted, whenever the processed semiconductor substrate is replaced with a new one. On the other hand, such an adjustment is not needed in the present invention, even when the processed semiconductor substrate is replaced with another, which facilitates the operation of the apparatus.

Further, a high-frequency induction heater requires working for providing a special ground terminal thereof, which is not needed in the apparatus of the present invention.

Although one semiconductor substrate is placed on the susceptor 33 in the above-described embodiment, this invention is not limited to this, but can be constructed such that a plurality of substrates are placed on the susceptor, and treated at the same time.

Moreover, though a semiconductor substrate formed of a III-V group compound is treated in the embodiment, another substrate formed of silicon, etc. can be treated.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A chemical vapor deposition apparatus for rowing a vapor-phase deposition layer on a semiconductor substrate, comprising:
   a base plate having opposed surfaces;
   a container to be attached to and removed from one surface of the base plate, and to establish a chamber to be supplied with a gas;
   a bearing secured to the other surface of the base plate;
   a hollow shaft rotatably supported by the bearing, one end portion of said shaft extending into said chamber through said base plate;
   driving means for rotating the shaft;

a casing arranged in the chamber, said casing being open at one end and mounted at the other end thereof to said one end portion of the shaft;

a susceptor in the open one end of the casing, said susceptor having a supporting surface on which a semiconductor substrate is to be placed and a concave recess opposite from said supporting surface;

a heat generator arranged in the casing for heating the susceptor and semiconductor substrate;

a conductive support for supplying power to and supporting said heat generator, said conductive support extending through said hollow shaft to said casing;

means for detecting the temperature of said heat generator, said detecting means extending through said hollow shaft to a distal end portion located in the concave recess of said susceptor; and control means for controlling the temperature of the heat generator in response to temperatures detected by the detecting means.

2. An apparatus according to claim 1, wherein the container is formed of stainless steel.

3. An apparatus according to claim 1, wherein the susceptor is formed of one of molybdenum and graphite.

4. An apparatus according to claim 1, wherein the heat generator is formed of one of tungsten, molybdenum and carbon.

5. An apparatus according to claim 1, wherein the detecting means comprises a thermocouple.

6. An apparatus according to claim 5, wherein the chamber includes cooling pipes therein.

* * * * *